United States Patent
LeBlanc et al.

(10) Patent No.: US 7,346,860 B1
(45) Date of Patent: Mar. 18, 2008

(54) USER NON-VOLATILE MEMORY INTERFACE MEGAFUNCTION

(75) Inventors: Marcel A. LeBlanc, Sunnyvale, CA (US); James G. Schleicher, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 303 days.

(21) Appl. No.: 10/796,699

(22) Filed: Mar. 8, 2004

(51) Int. Cl.
*G06F 17/50* (2006.01)

(52) U.S. Cl. .................... 716/1; 716/6; 716/17
(58) Field of Classification Search ............ 716/1, 716/2, 6, 12, 17
See application file for complete search history.

(56) References Cited

U.S. PATENT DOCUMENTS

2005/0137840 A1* 6/2005 Peck et al. ............. 703/13

* cited by examiner

*Primary Examiner*—Thuan Do

(57) ABSTRACT

An interface for a programmable logic device having a non-volatile memory where a portion of the non-volatile memory is user accessible is provided. A megafunction provides the electronic circuit designer with interface protocol options for the user accessible portion of the non-volatile memory block. The circuitry associated with the user selected interface is then programmed into the programmable logic device.

12 Claims, 15 Drawing Sheets

US 7,346,860 B1

USER NON-VOLATILE MEMORY INTERFACE MEGAFUNCTION

BACKGROUND OF THE INVENTION

This invention is directed to programmable logic devices ("PLD"). More particularly, this invention is related to communications between a memory block and other portions of the PLD or communications between a memory block on a PLD and other electronic devices.

A programmable logic device ("PLD") is a programmable integrated circuit that allows a user, using software control, to program particular logic functions the circuit will perform. When an integrated circuit manufacturer supplies a typical programmable logic device, it is not yet capable of performing any specific function. The user, in conjunction with software supplied by the manufacturer or created by the user or an affiliated source, can program the PLD to perform a particular function or functions required by the user's application. The PLD then can function in a larger system designed by the user just as though dedicated logic chips were employed.

As used herein PLDs include complex PLDs ("CPLDs"), programmable array logic ("PALs"), programmable logic arrays ("PLAs"), field PLAs ("FPLAs"), erasable PLDs ("EPLDs"), electrically erasable PLDs ("EEPLDs"), logic cell arrays ("LCAs"), field programmable gate arrays ("FPGAs").

In addition to the general purpose circuitry typically included in the architecture of a PLD, PLDs may also include various types of special-purpose circuitry, referred to as functional blocks. Examples of such special-purpose circuitry are microprocessor circuitry, digital signal processing (DSP) circuitry, memory blocks, etc.

Because PLDs are typically designed to satisfy any of a wide range of needs, it may also be desirable for any special-purpose circuitry that is included to also have some flexibility with regard to the functions it can perform. For example, in the case of a user non-volatile memory block, it may be desirable to provide multiple interface protocols and allow the user to select the desired protocol. Additionally, it may be desirable to have such flexibility while minimizing the circuitry needed to provide the multiple interface protocols.

SUMMARY OF THE INVENTION

The present invention is directed to a programmable logic device having a non-volatile memory where a portion of the non-volatile memory is user accessible. A megafunction provides the electronic circuit designer with interface protocol options for the user accessible portion of the non-volatile memory block on a programmable logic device. A megafunction is a pre-designed, pre-verified parameterized implementation of system-level functions which reduces the customer's design task to custom logic surrounding such commonly used system-level functions. The circuitry associated with the selected interface is then programmed into the programmable logic device.

By providing the user with the option of selecting the desired interface protocol, the designer now has the flexibility of choosing from a variety of interface protocols in use today. Additionally, only the circuitry associated with the selected interface protocol is then programmed on the PLD device. Thus, the designer has the flexibility of selecting from multiple interfaces while minimizing the circuitry needed to provide such flexibility.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
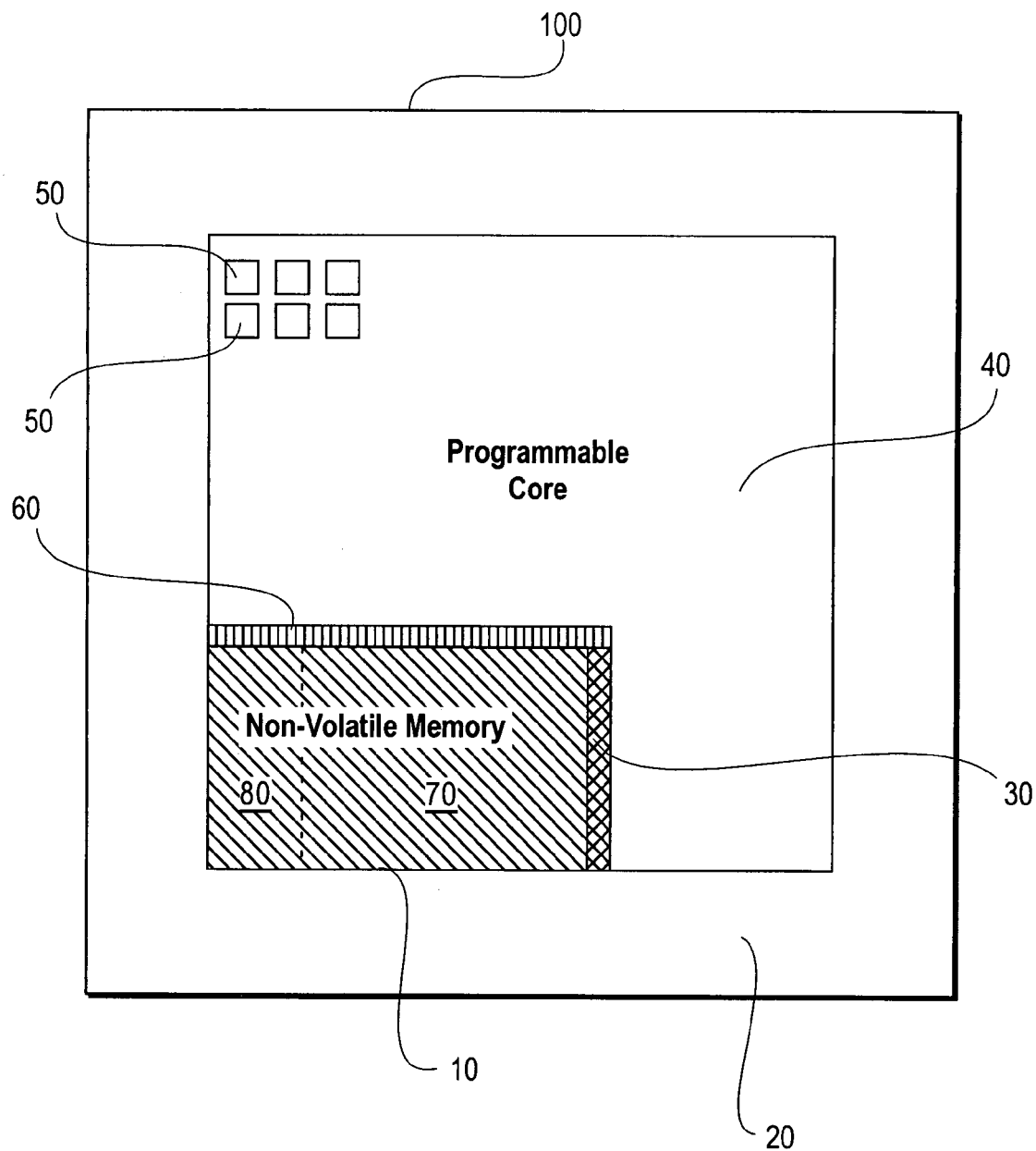
FIG. 1 shows a schematic overview of a programmable logic device 100 incorporating the present invention.

FIG. 1 shows a schematic overview of a programmable logic device 100 incorporating the present invention. Device 100 includes the programmable core 40, periphery region 20, a non-volatile memory block 10, and a VIO interface block 60. Device 100 may include additional VIO blocks not shown in the figure. Some embodiments also include an interface block 30. Interface block 30 is used to communicate signals between the memory 10 and the programmable core 40. In embodiments not including the interface block 30, the VIO interface block 60 is used to communicate signals between memory block 10 and programmable core 40. The periphery region 20 includes input/output elements, phase-locked loop circuitry, power bus segments and the like.

Programmable logic core 40 includes a plurality of logic elements 50 disposed on the device in a two-dimensional array of intersecting rows and columns of such regions. Logic elements 50 include programmable registers, preferably flip-flops. Logic elements 50 may further include look-up tables or universal logic blocks, pterms, carry and cascade chains and other circuitry to perform various functions of the programmable logic device. In some embodiments, a plurality of logic elements in the array may be grouped to form logic array blocks.

Non-volatile memory block 10 includes two regions. Region 70 is used to store configuration data for device 100. Memory block 10 also includes a region 80. Region 80 is dedicated to storing user information and is accessible to the user through the core at any time that the chip is not performing configuration related operations such as download, ISC or test. Preferably, to avoid haphazard changes to the chip configuration, the access to region 70 is blocked while the user accesses region 80. Memory 10 also includes a raw UNVM interface (shown in FIG. 2) for controlling the memory circuitry. This interface is wrapped with the UNVM megafunction to map the raw UNVM interface to a user's desired interface.

Figure 2:
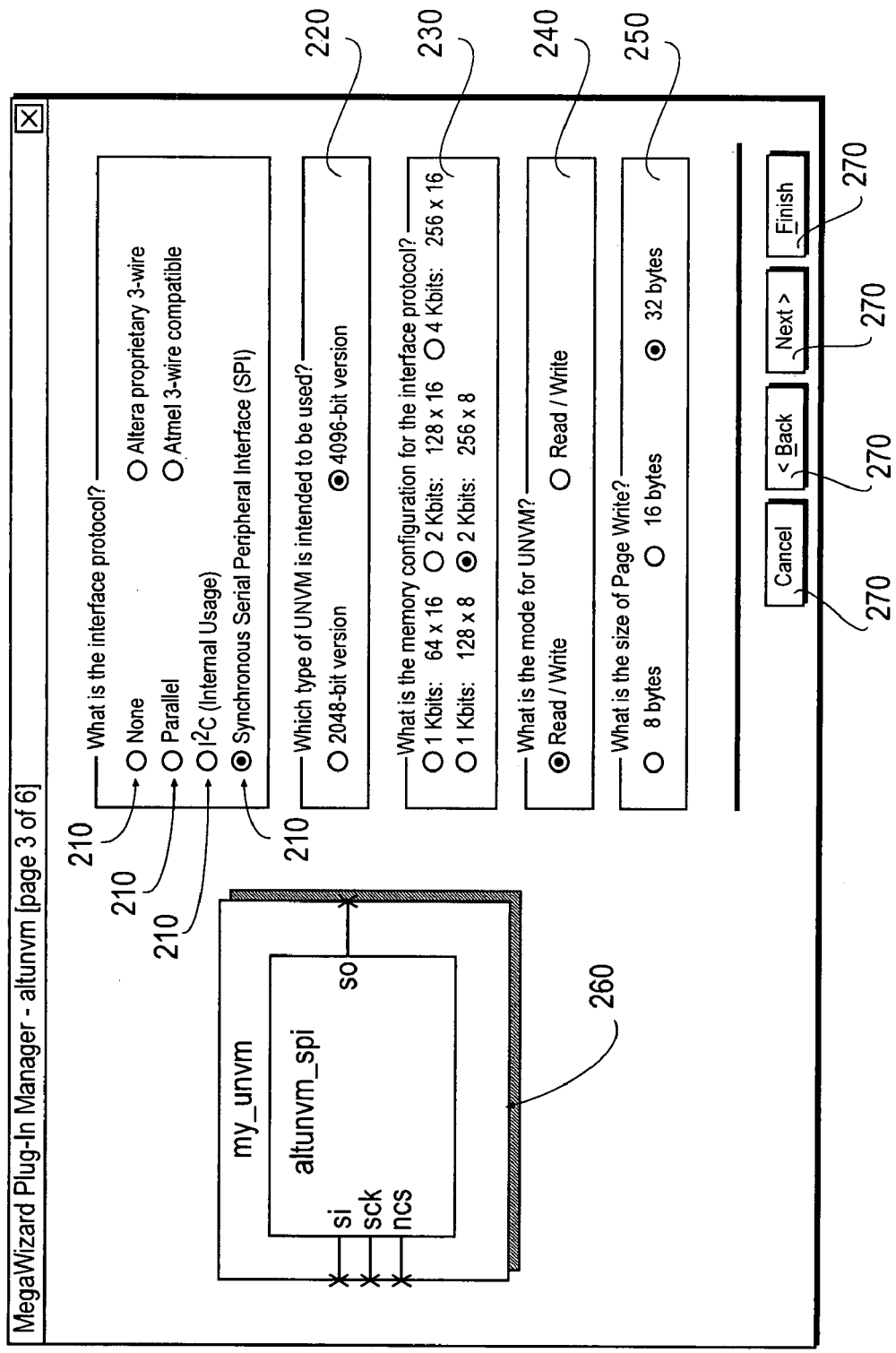
FIG. 2 presents an example window from a graphical user interface that may be used with the UNVM megafunction.

FIG. 2 presents an example window from a graphical user interface that may be used with the UNVM megafunction. The plug-in associated with the UNVM megafunction provides a wizard that prompts the electronic designer to specify the interface protocol and parameters associated with each interface protocol. A wizard is generally any software that assists a user in completing a task such as filling out a form or template. Here, the wizard presents the user with options for selecting the interface protocol and specifying the parameters associated with that interface protocol.

As shown in FIG. 2, a window 205 is displayed during use of the UNVM interface plug-in once the designer has selected the use of the user non-volatile memory. Window 205 gives the user/developer the option of choosing one of several types of interface protocols 210. Preferably, the user may select from the following interface protocols: None, Parallel, I²C and Synchronous Serial Peripheral Interface (SPI). Additional interface protocols may include a 3-wire interface of the type provided by Altera Corporation of San Jose, Calif. Yet another additional interface protocol may be a 3-wire compatible interface of the type provided my Atmel Corporation of San Jose, Calif. Other interface protocols not shown are also contemplated by the invention.

In response to the interface protocol 210 selected, the user is further prompted to specify the memory type in window 220, the memory configuration in window 230, the mode in window 240 and the Page Write size in window 250. Further, window 205 includes a symbol representation 260 that presents the parameterized megafunction in a schematic form that depicts the user selected parameter values. Symbol representation 260 also indicates the inputs and outputs for the selected interface.

Window 220 prompts the user to select a memory type. Preferably, the memory types available to the user include a 2K memory or a 4K memory. Window 230 prompts the user to select a memory configuration for the selected interface protocol. Preferably, the available memory configurations are selected from the following: 1 Kbits: 64×16, 1 Kbits: 128×8, 2 Kbits: 128×16, 2 Kbits: 256×8 or 4 Kbits: 256×16. In window 240, the user can select the mode for the selected interface protocols. Preferably, the modes are read only or read/write. Window 250 allows the user to specify the size of the Page Write. Preferably, the available page sizes include 8 bytes, 16 bytes, or 32 bytes.

Finally, window 205 includes four buttons 270. These buttons allow the user/developer to cancel the process, move to a previous page of the wizard, move to a next page of the wizard, and complete the use of the wizard.

Figure 9:
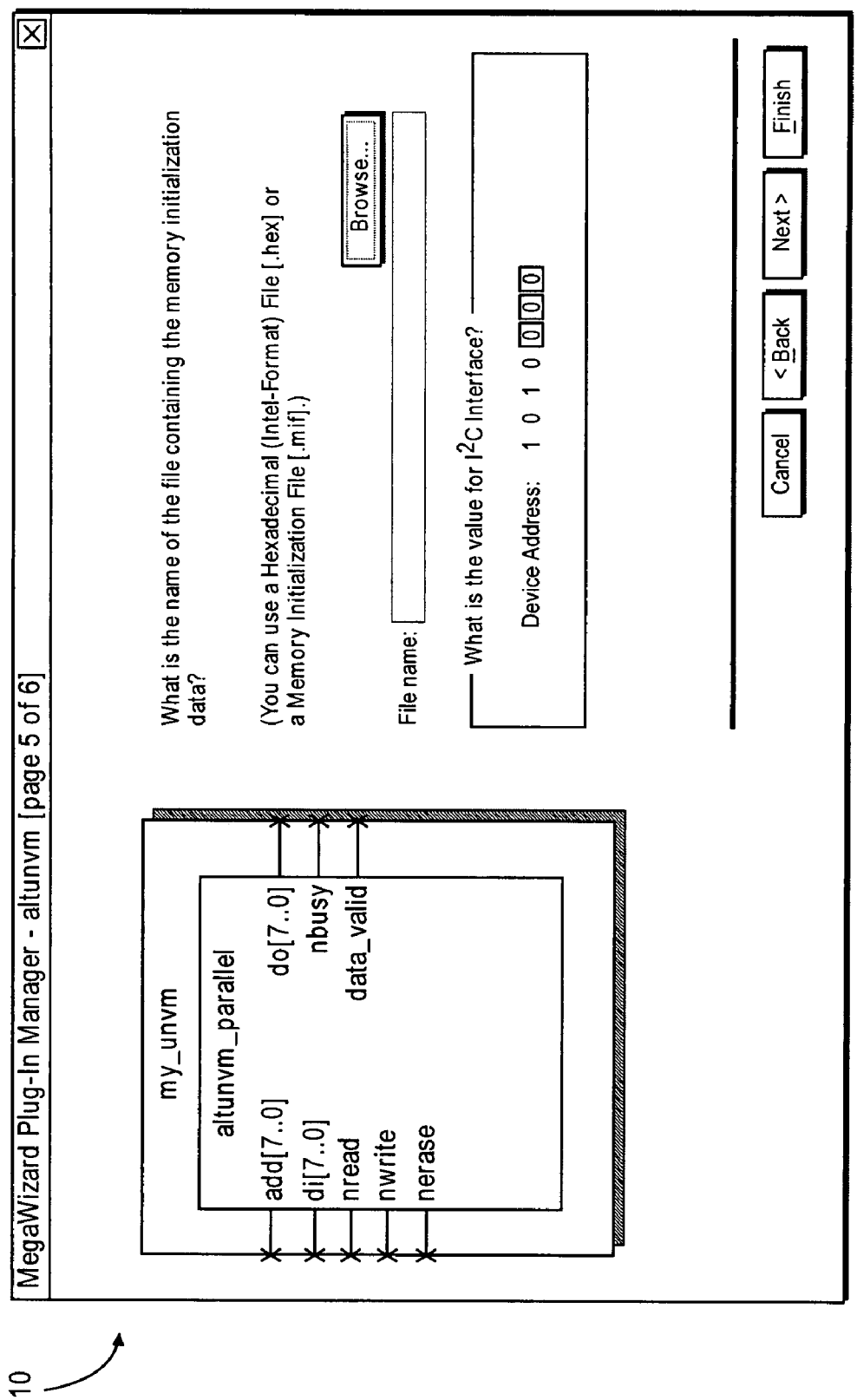
FIG. 9 is an illustration of a second GUI window presented to a user when the user selects the parallel interface in accordance with one embodiment of this invention.

It may be convenient in some cases to present the wizard options in multiple pages (separate control windows). Another page of the UNVM interface wizard might, for example, give the user/developer the option of specifying the name of the file containing the memory initialization data (see FIG. 9) or to specify the initial memory content (see FIG. 6). To move between these various pages of the wizard, the user simply clicks on the "back" or "next" buttons. When the user is satisfied with his or her selections for the megafunction, he or she selects the "finish" button 270. This causes the plug-in to package the user's settings and provide them to a plug-in manager that further processes the user selections and makes them available to a compiler.

Figure 3:
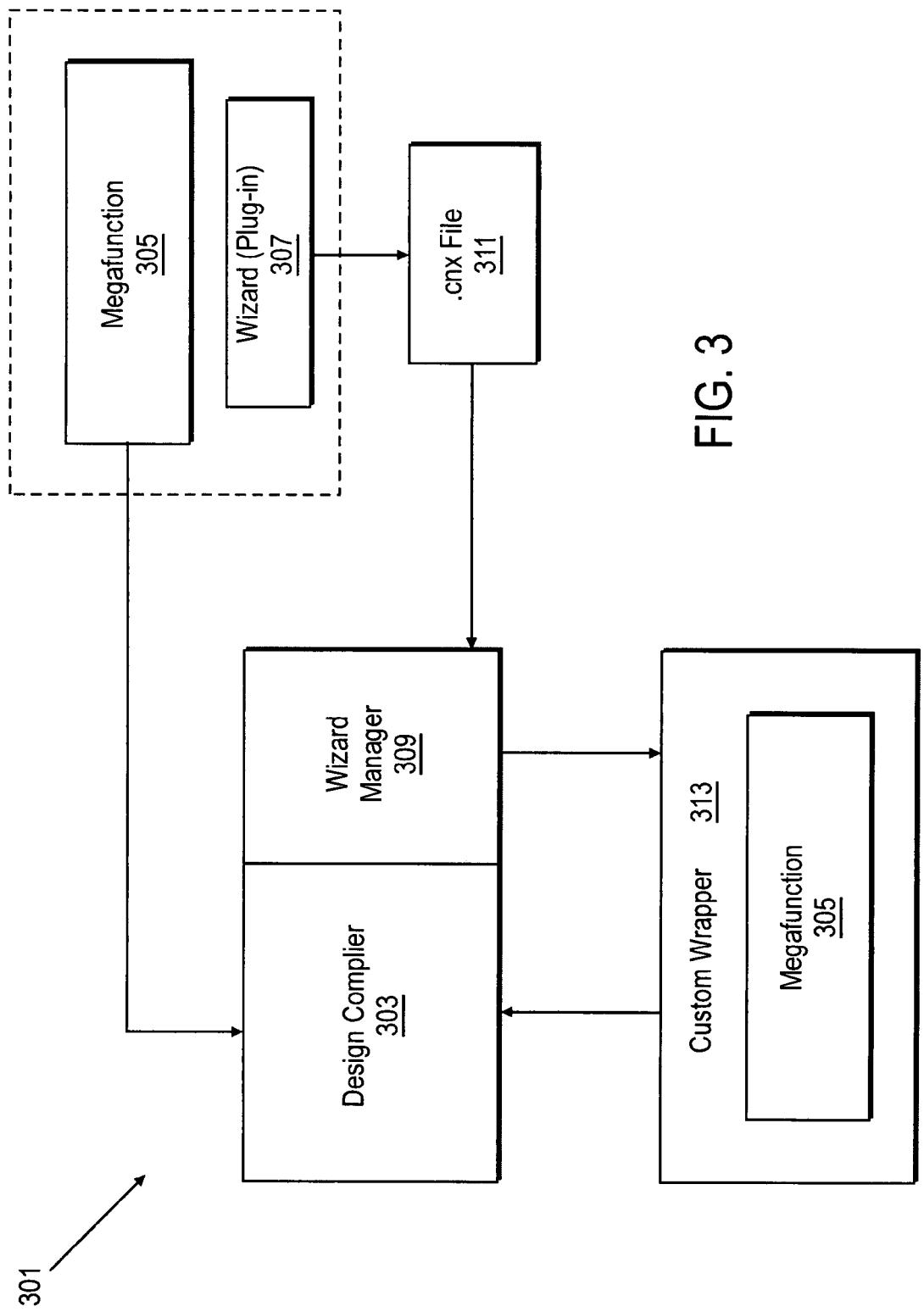
FIG. 3 presents a system for using a plug-in and associated wizard interface in accordance with one embodiment of this invention.

FIG. 3 presents a system for using a plug-in and associated wizard interface in accordance with one embodiment of this invention. As shown, system 301 includes an EDA environment 303 including a compiler that compiles user designs comprising Hardware Description Language schematic blocks, timing constraints, floor plans, etc. EDA environment 303 may make use of megafunctions such as UNVM megafunction 305 during compilation of a user's design. For this to occur, the user must somehow specify that megafunction 305 is integrated in his or her design.

In accordance with this invention, UNVM megafunction 305 is associated with a wizard plug-in 307 that presents the user/developer with various options for assigning values to pertinent parameters or otherwise constraining the functioning of UNVM megafunction 305. As noted above, a plug-in such as plug-in 307 may present a graphical user interface, such as window 205 depicted in FIG. 2. Plug-in 307 plugs into a plug-in manager 309. Manager 309 is able to launch the wizard associated with plug-in 307 when a user/developer makes use of UNVM megafunction 305. It may accomplish this by locating the appropriate plug-in for the UNVM megafunction in the user's file system.

During operation, the wizard associated with plug-in 307 presents the user/developer with various options for constraining megafunction 305. The user's selections are saved during the process and packaged in a "parameter file" 311 when the user finishes the process. In FIG. 3 parameter file 311 is denoted by the extension ".cnx". File 311 may include parameter information, custom symbol information, connection information, and the like. The custom symbol information may specify the appearance of the symbol for a schematic editor used by environment 303.

Note that many design environments allow users to edit their designs with a schematic editing tool operating on a schematic depiction of the design in progress. The custom symbol information for the UNVM interface shown in FIG. 2 may include symbol 260. The connection information in parameter file 311 specifies the user-selected types of connections to various ports of megafunction 305. For example, file 311 may specify connections to the "si", "sck", "ncs" and "so" signals where the megafunction is providing connectivity using an SPI protocol.

Parameter file 311 is provided to plug-in manager 309, which takes that information and creates a wrapper file 313 associated with megafunction 305. Essentially, wrapper file 313 is a top-level design file that may be viewed as enveloping megafunction 305. Preferably wrapper file 313 is in HDL format. Wrapper file 313 houses all the parameters that the user selected in window 205 of FIG. 2.

Note that in this example plug-in manager 309 is tightly integrated with EDA environment 303. This integration is not necessary as manager 309 may be provided as a separate "stand-alone" application design to run in conjunction with a particular design environment.

Figure 4:
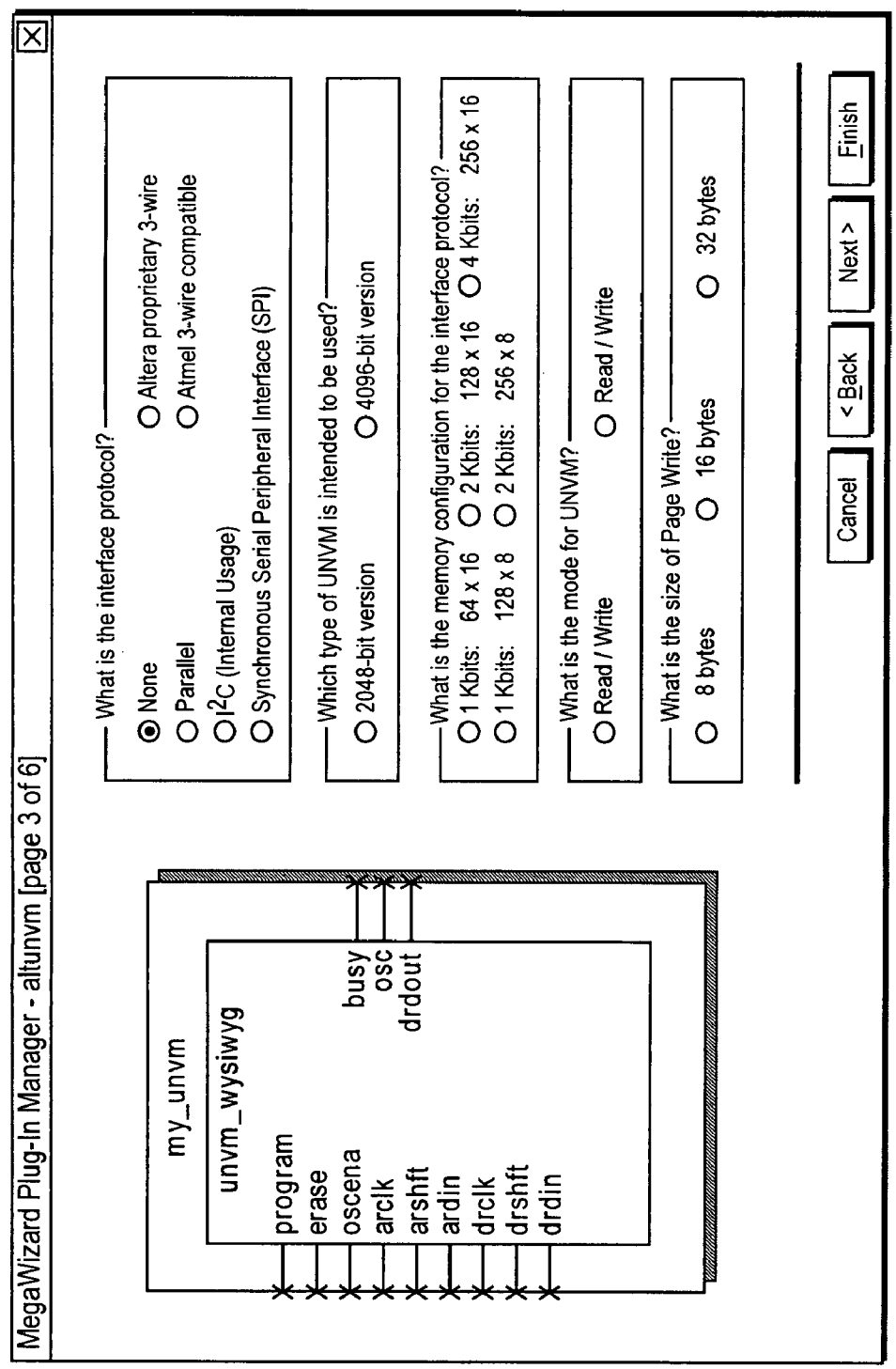
FIG. 4 shows a GUI window where the user has selected to use the raw UNVM interface for the memory block in accordance with an embodiment of the invention.
Figure 5:
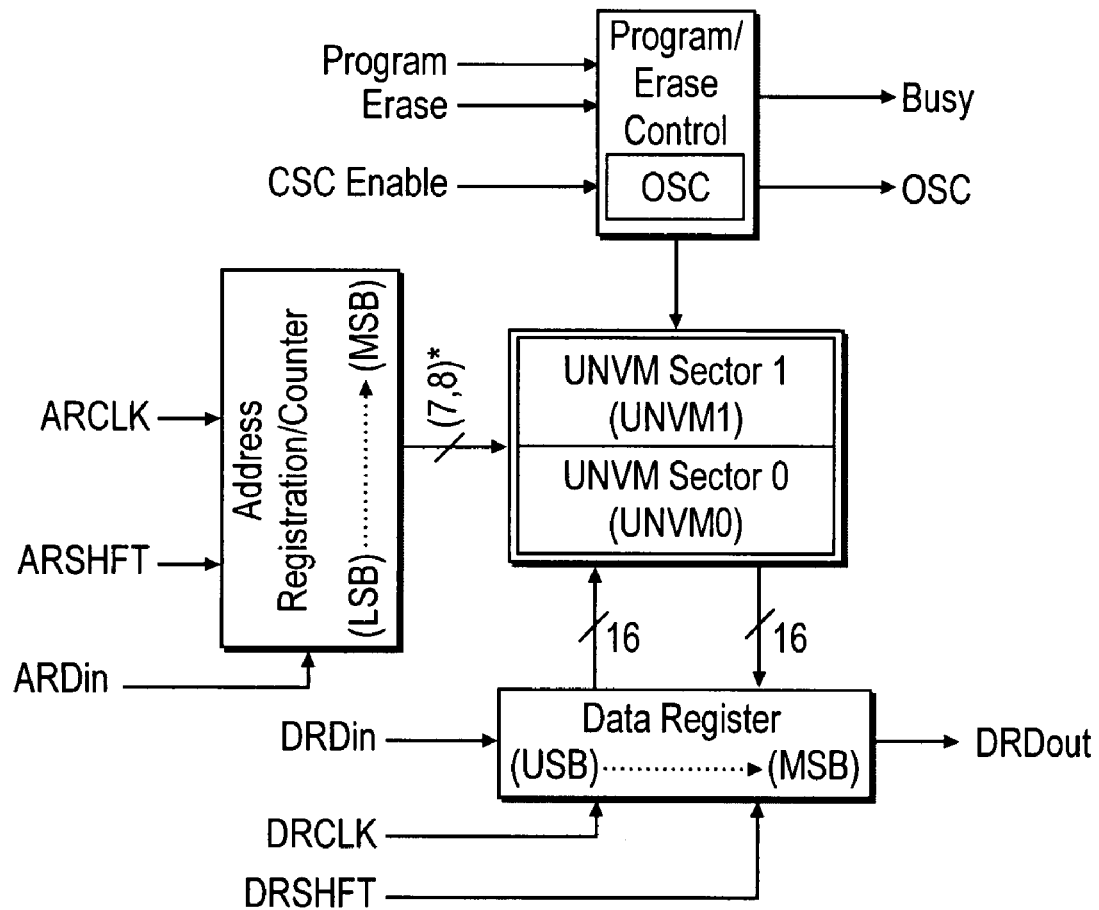
FIG. 5 is a schematic illustration of raw UNVM interface When the user selects to use the raw UNVM interface, the plug-in manager further presents the user with window 601 (FIG. 6) in accordance with an embodiment of the invention.
Figure 6:
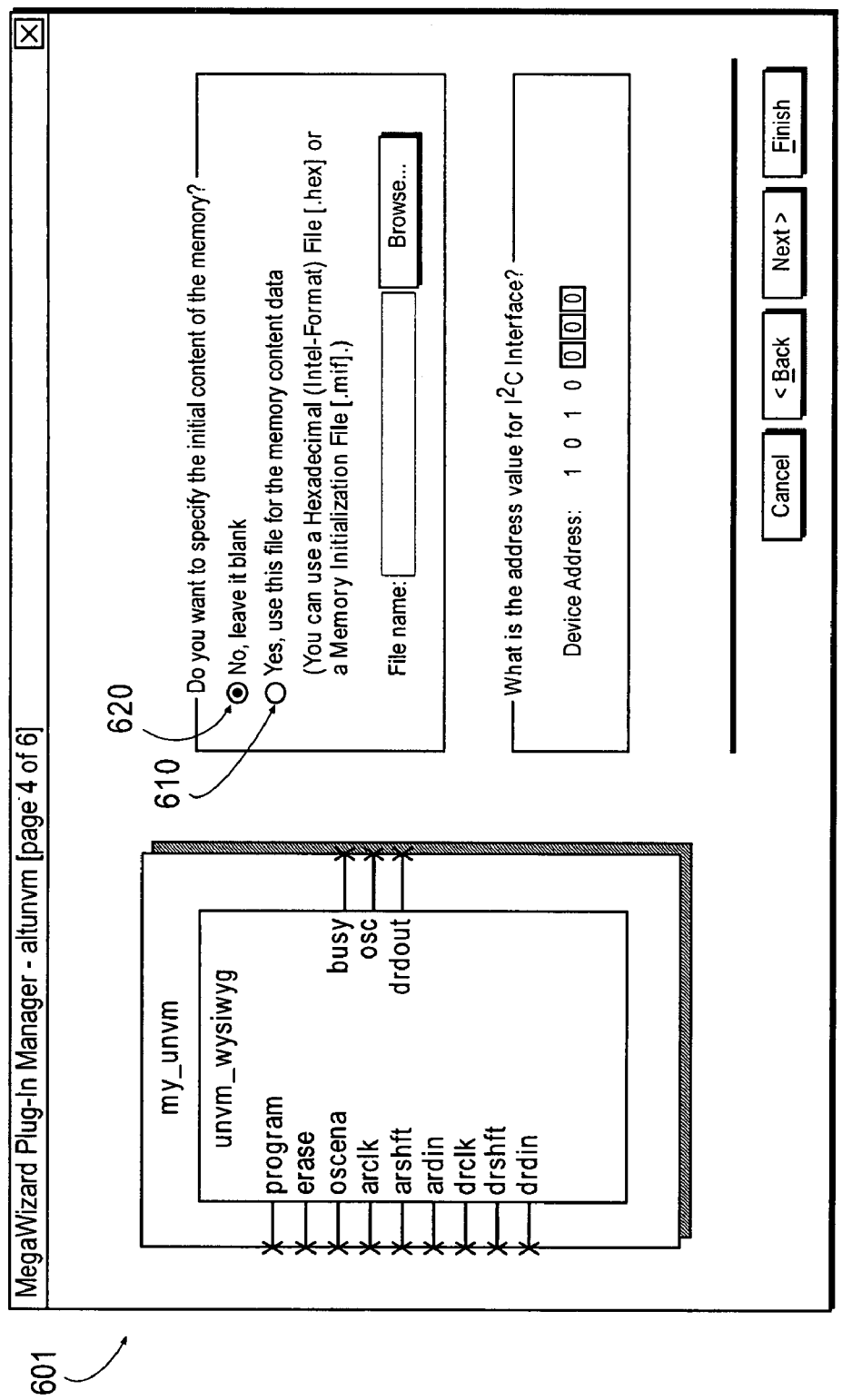
FIG. 6 is an illustration of a second GUI window presented to a user when the user selects the raw UNVM interface in accordance with one embodiment of this invention.

FIG. 4 shows the window 205 where the user has selected to use the raw UNVM interface for the memory block 10 (FIG. 1). The raw UNVM interface is shown in FIG. 5. The raw UNVM interface uses 12 pins for communicating with the programmable core 40. When the user selects this option, the UNVM megafunction calls out the raw UNVM WYSIWYG to the user. The user can then produce a custom interface design to allow communication between the raw UNVM WYSIWYG and outside logic. When the user selects to use the raw UNVM interface, the plug-in manager further presents the user with window 601 (FIG. 6). In window 601, the user can choose to specify the initial memory content 610 or leave the memory blank 620.

Figure 7:
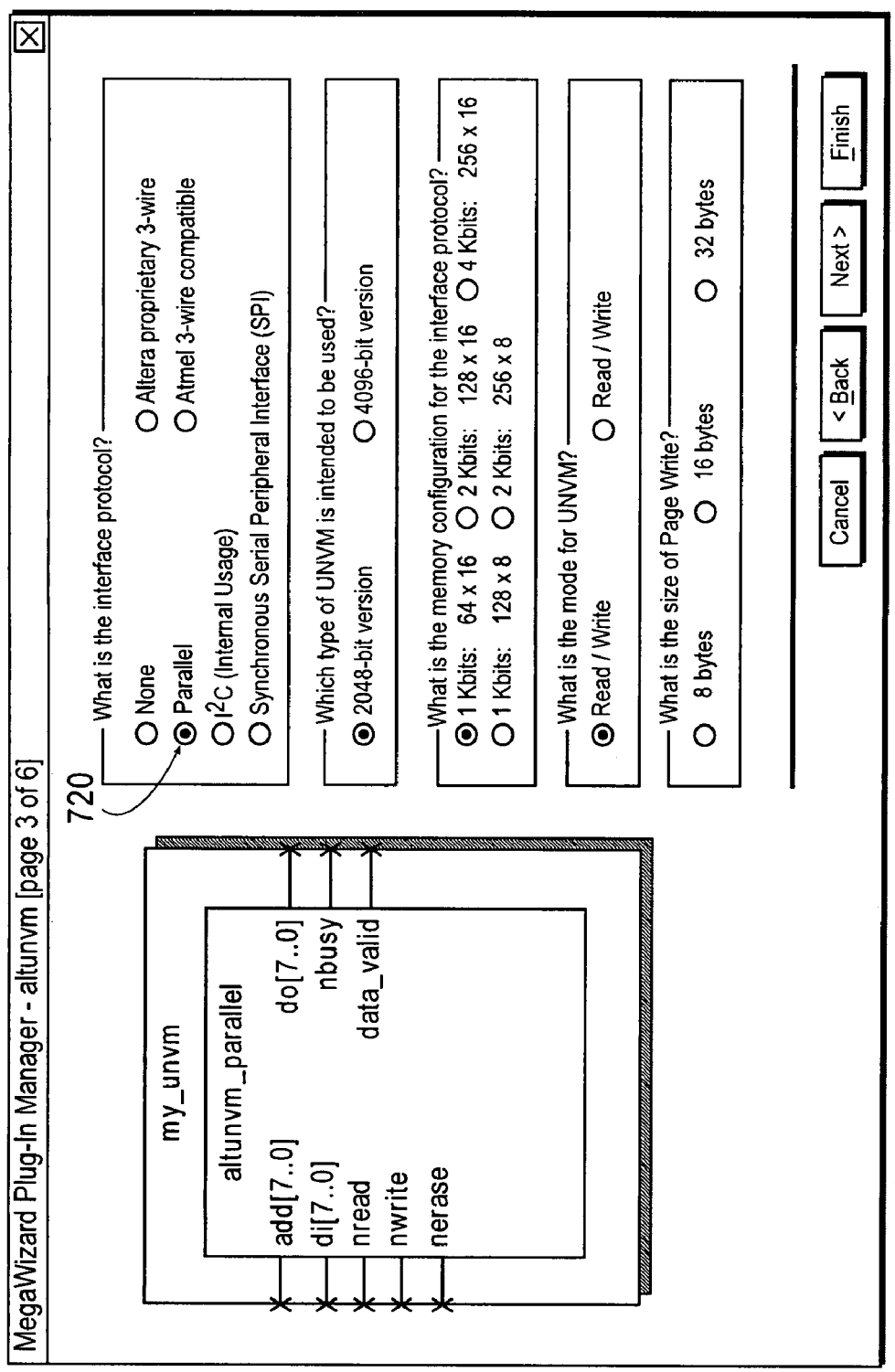
FIG. 7 shows a window where the user has selected to use a parallel interface for a memory block in accordance with an embodiment of the invention.
Figure 8:
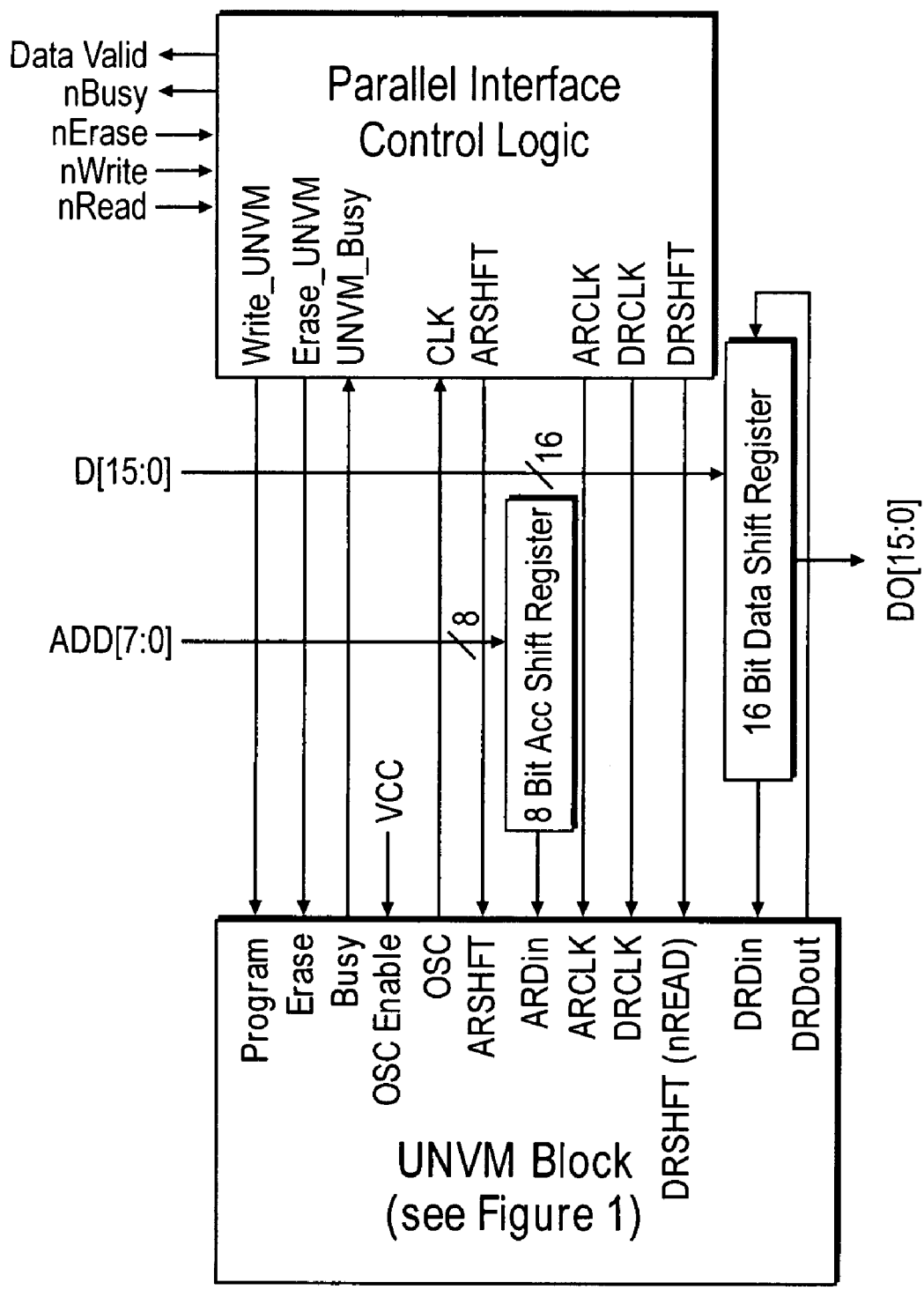
FIG. 8 shows the parallel interface schematic in accordance with an embodiment of the invention.

FIG. 7 shows the window 205 where the user has selected to use a parallel interface 710 for the memory block 10. FIG. 8 shows the parallel interface schematic. This interface allows parallel communication between the memory block 10 and outside logic. Once the Read, Write or Erase request is asserted, the outside logic is free to do other operations while the data inside memory 10 is being retrieved, written or erased independently. While the data is being retrieved from UNVM, written to UNVM, or erased in UNVM, the interface is not available to respond to any further requests. Additionally, the Read, Write, and Erase operations cannot be asserted at the same time. If this happens, the interface will not process any of the requests. A window 910 (FIG. 9) associated with window 205 further prompts the user to specify the file containing the memory initialization data.

Figure 10:
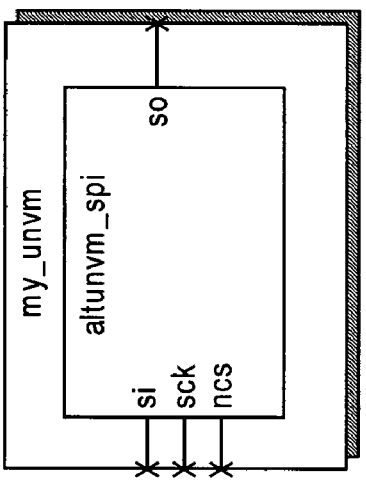
FIG. 10 shows a window where the user has selected to use the Synchronous Serial Interface ("SPI") for a memory block in accordance with an embodiment of the invention.
Figure 11:
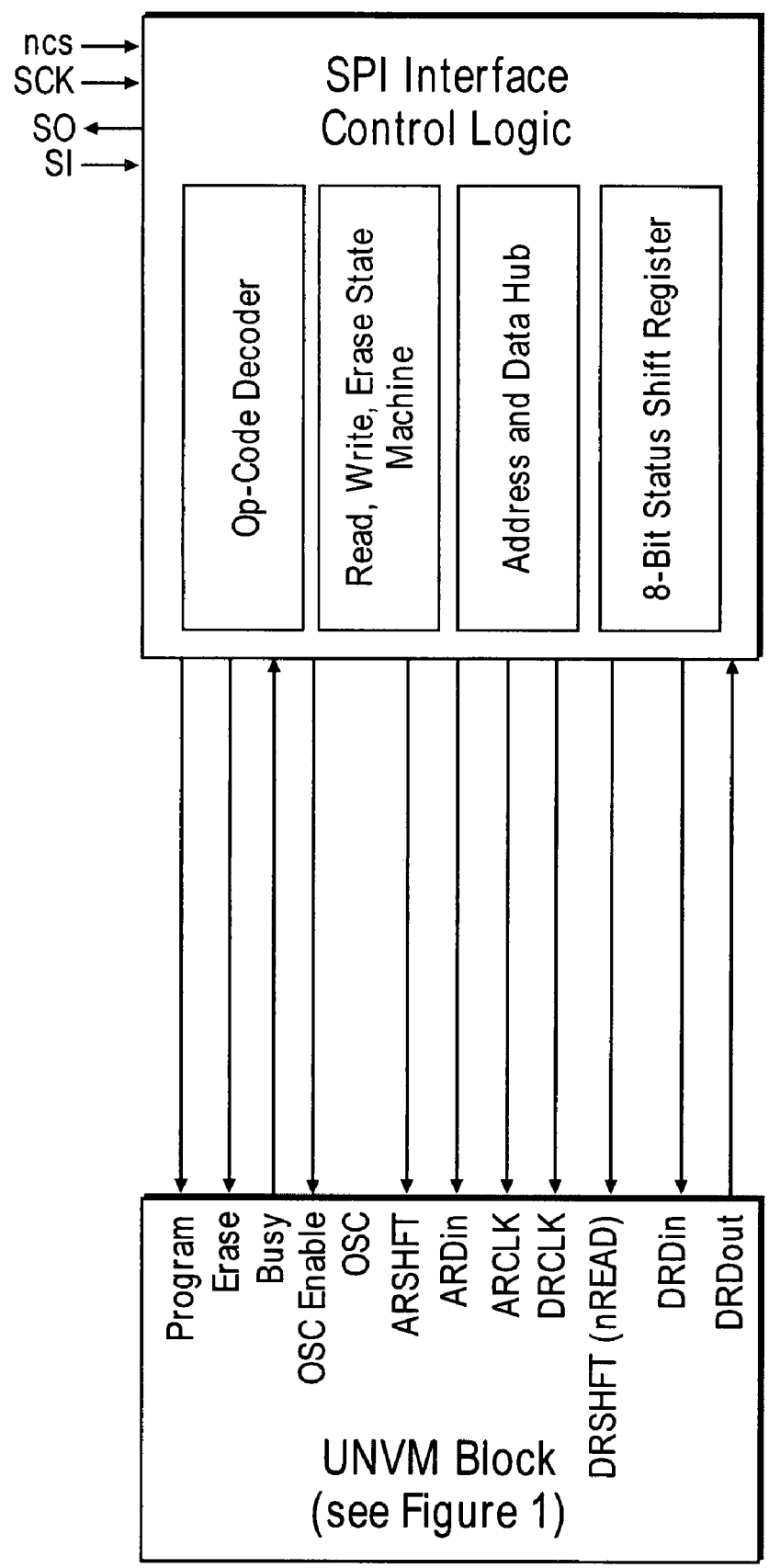
FIG. 11 is a schematic illustration of the SPI interface in accordance with an embodiment of the invention.

FIG. 10 shows the window 205 where the user has selected to use the Synchronous Serial Interface ("SPI") for the memory block 10. The SPI interface is shown in FIG. 11. Generally, SPI interfaces have a Master or Slave device where the Master device initiates service request and the Slave device responds to the service request. Preferably, the interface for memory block 10 is configured as a Slave device.

The SPI interface has 4 pins: Serial Data Input (SI) and Serial Data Output (SO) to serially receive or transmit data. Serial Data Clock (SCK) is the clock signal produced from the Master device to synchronize the data transfer. Data will be input to the Slave device through SI at positive clock edge of SCK. While the data output from the Slave device through SO at negative clock edge of SCK. nCS is the active low signal. When nCS is asserted, the current device is selected by the Master device from the other end of the SPI bus for service. When nCS is not asserted, the SI and SCK ports are blocked from receiving signals from the Master Device.

Figure 12:
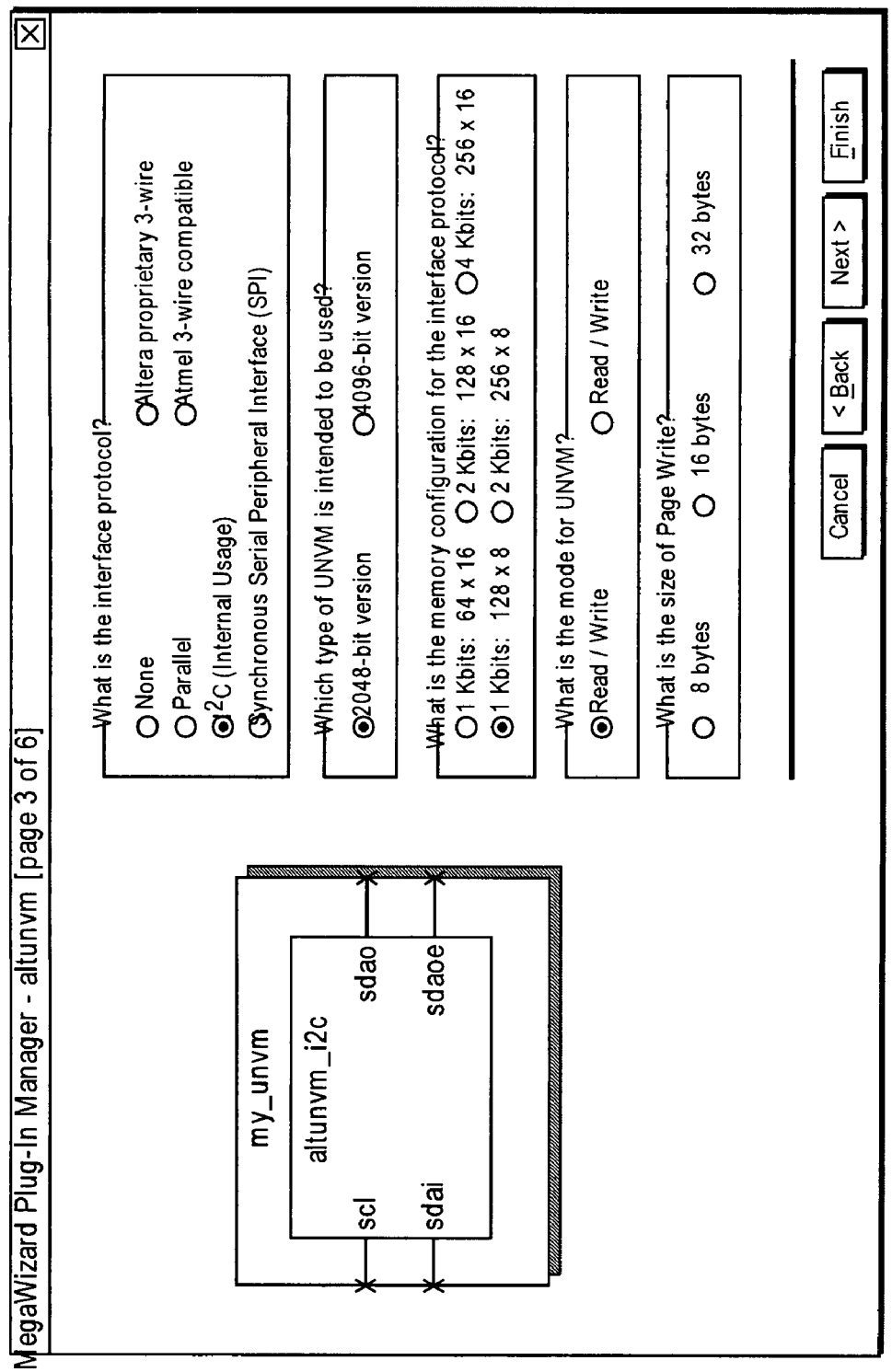
FIG. 12 shows a window where the user has selected to use the I$^2$C interface for a memory block in accordance with an embodiment of the invention.
Figure 13:
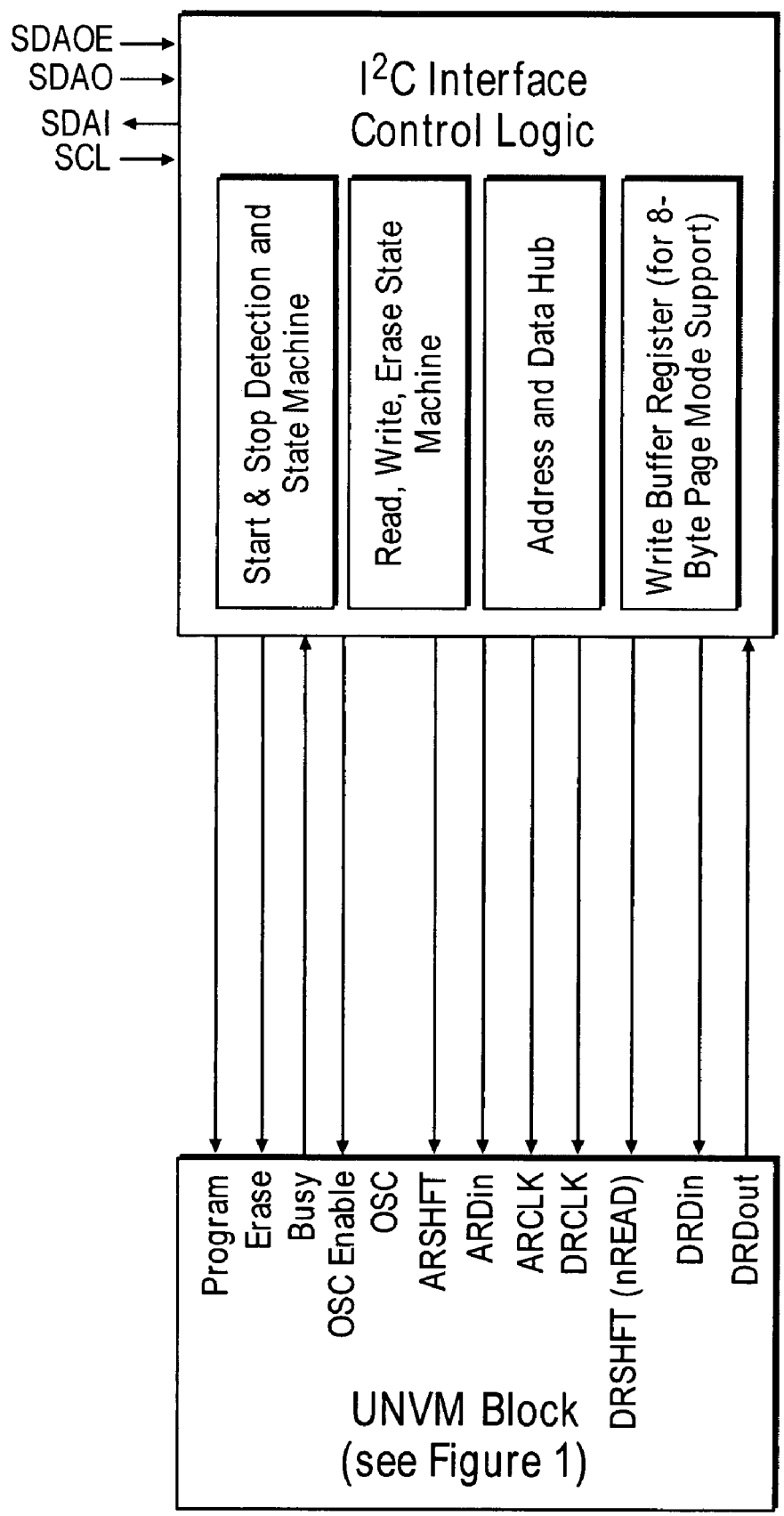
FIG. 13 is a schematic illustration of the I$^2$C interface in accordance with an embodiment of the invention.

FIG. 12 shows the window 205 where the user has selected to use the I²C interface for the memory block 10. The I²C interface is shown in FIG. 13. The I²C uses only two wires for communication: Serial Clock (SCL) and Serial Data (SDA) where both lines are bidirectional. Preferably, the SDA port is replaced by SDAI, SDAO, and SDAOE ports. SDAI port is used to receive input data, SDAO port is used to transmit output data, SDAOE port is the output enable to regulate input to SDAI and output from SDAO. Preferably, ports SDAI, SDAO, and SDAOE are connected to a single IO pin that acts as an SDA pin.

Figure 14:
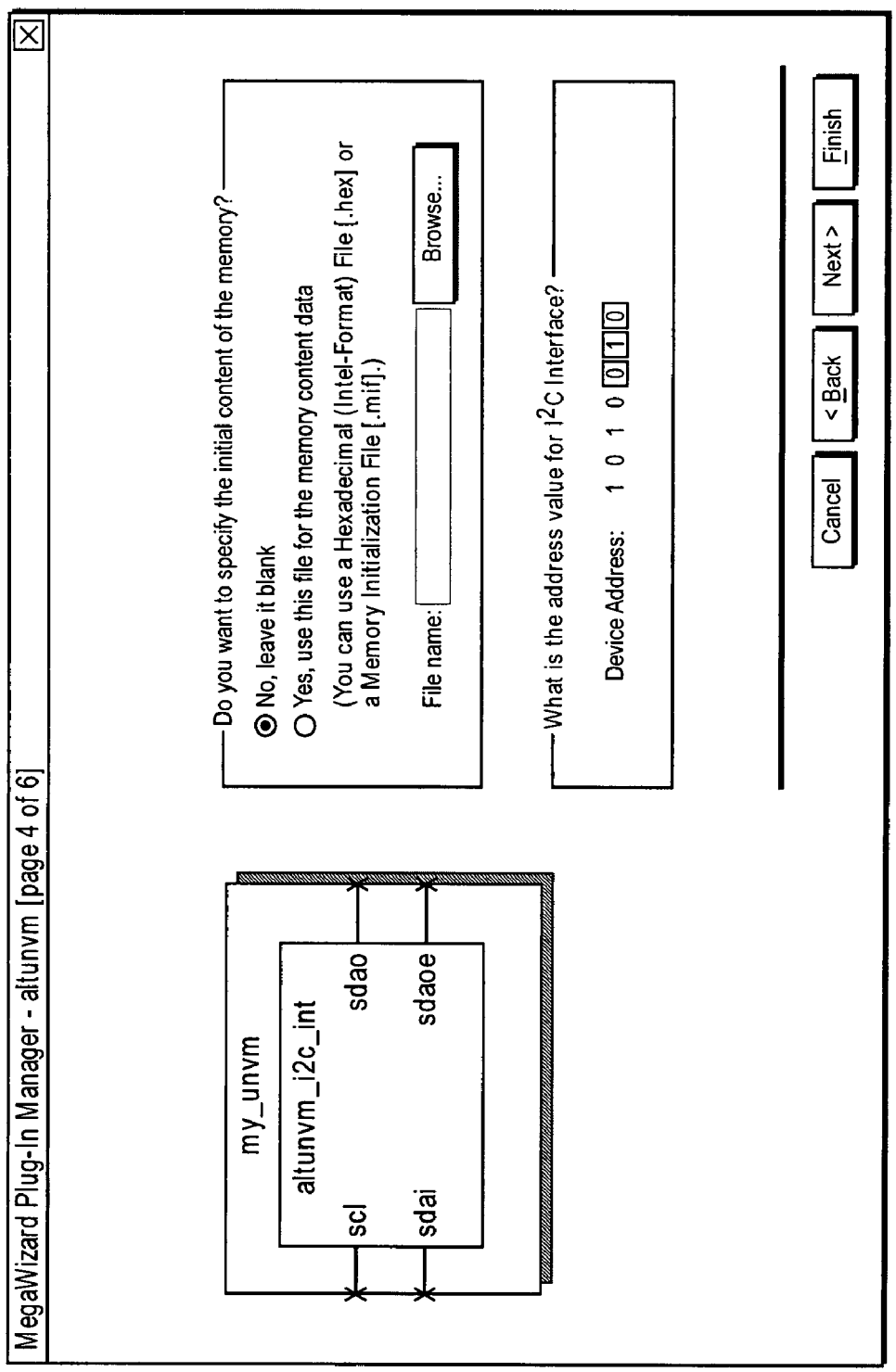
FIG. 14 is an illustration of a second GUI window presented to a user when the user selects the I$^2$C interface in accordance with one embodiment of this invention.

The I²C interface also has Master and Slave devices. Preferably, the I²C is configured as a Slave device. Preferably, the Master devices generate clock signals on the SCL line for communication on the I²C interface. Preferably, SCL is an input, Data will be input to Slave device through SDAI at the positive clock edge of SCL, data will be output from the Slave device through SDAO at the negative clock edge of SCL. A window 1401 (FIG. 14) gives a user the option of specifying the memory content or leaving the memory content blank.

Figure 15:
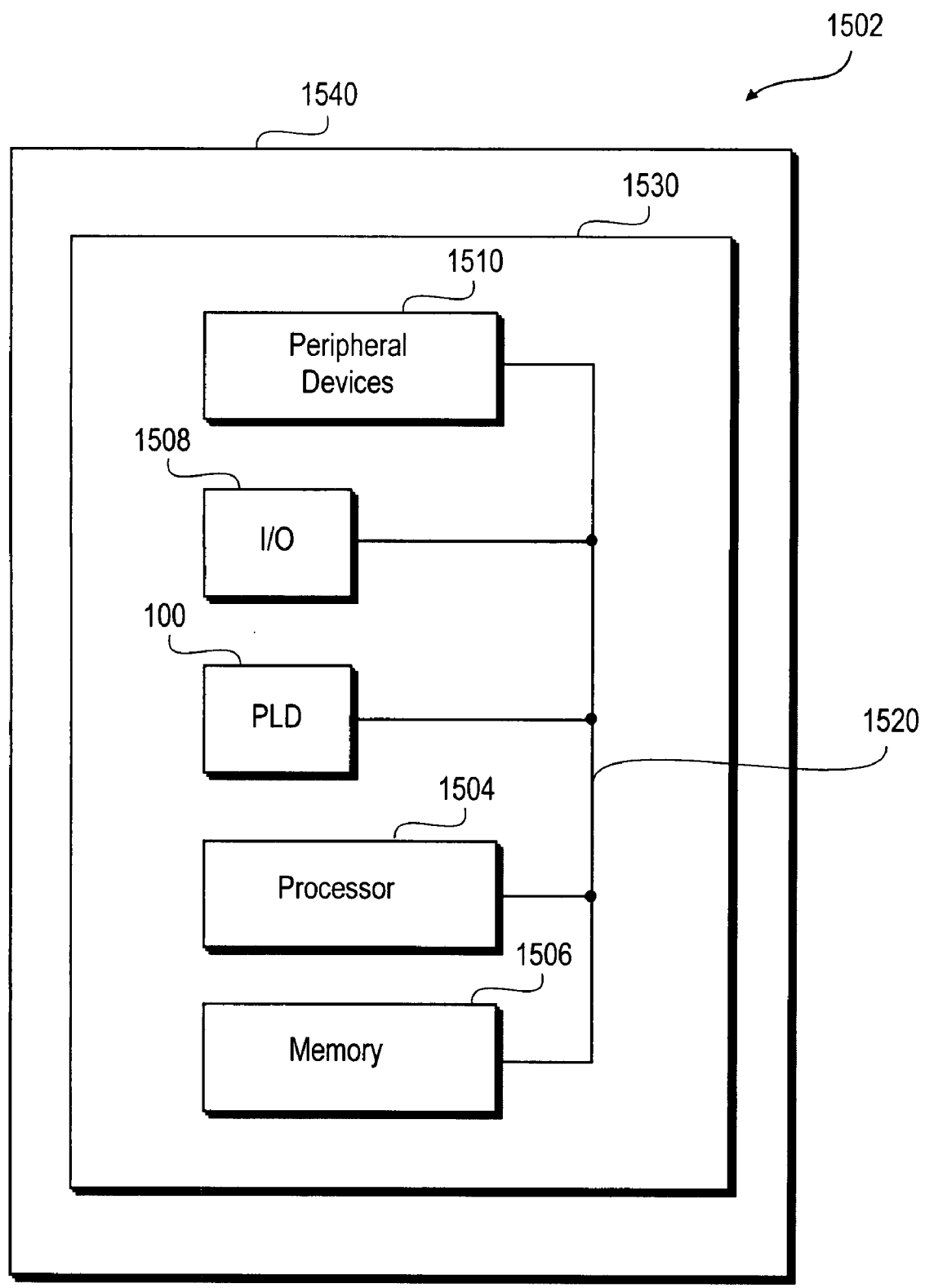
FIG. 15 illustrates a data processing system incorporating the programmable logic device of this invention.

FIG. 15 illustrates a programmable logic device 100 of this invention in a data processing system 1502. Data processing system 1502 may include one or more of the following components: a processor 1504; memory 1506; I/O circuitry 1508; and peripheral devices 1510. These components are coupled together by a system bus 1520 and are populated on a circuit board 1530 which is contained in an end-user system 1540.

System 1502 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1504.

Programmable logic device 100 may also be used as an arbiter for arbitrating access to a shared resource in system 1502. In yet another example, programmable logic device 100 can be configured as an interface between processor 1504 and one of the other components in system 1502. It should be noted that system 1502 is only exemplary, and that the true scope and spirit of the invention should be indicated by the following claims.

The foregoing description of specific embodiments of the invention has been presented for the purposes of illustration and description. It is not intended to be exhaustive or to limit the invention to the precise form described. Many modifications and variations are possible in light of the teachings above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of generating a user non-volatile memory interface megafunction for a programmable logic device having a user accessible non-volatile memory ("UNVM"), the programmable logic device including a raw UNVM interface for passing signals to and from the user accessible non-volatile memory, the method comprising:
   selecting an interface protocol;
   specifying zero or more parameter values for the selected interface protocol;
   generating a user non-volatile memory interface megafunction using the selected interface protocol and the specified parameter values;
   configuring the programmable logic device as the user non-volatile memory interface using the generated user non-volatile memory interface megafunction;
   wherein the user non-volatile memory interface passes signals to and from the raw UNVM interface.

2. The method of claim 1 wherein the interface protocol is selected from a group comprising one or more of the following: None, Parallel interface, SPI interface, I²C interface, 3-wire interface and 3-wire compatible interface.

3. The method of claim 1 wherein the one or more parameter values include one or more of the following: memory type, memory configuration, mode, page size, and/or device address.

4. The method of claim 3 wherein the memory type is selected from one or more of the following: 2 Kbits or 4 Kbits.

5. The method of claim 3 wherein the memory configuration is selected from one or more of the following: 1 Kbits: 64×16, 1 Kbits: 128×8, 2 Kbits: 128×16, 2 Kbits: 256×8 or 4 Kbits: 256×16.

6. The method of claim 3 wherein the mode is selected from at least the following: read only or read/write.

7. The method of claim 3 wherein the page size is selected from at least the following: 8 bytes, 16 bytes, or 32 bytes.

8. The method of claim 3 wherein the device address is a binary number value.

9. The method of claim 1 further comprising compiling an electronic design including instructions specifying the user non-volatile memory interface megafunction to produce instructions for producing an integrated circuit having the user non-volatile memory interface megafunction incorporated therein.

10. The method of claim 1 wherein the one or more parameters are specified on a graphical user interface.

11. A computer program product comprising a computer readable medium on which is stored program instructions for a method of generating a user non-volatile memory interface megafunction for a programmable logic device having a user accessible non-volatile memory ("UNVM"), the programmable logic device including a raw UNVM interface, the method comprising:

selecting an interface protocol;
specifying zero or more parameter values for the selected interface protocol;
generating a user non-volatile memory interface megafunction using the selected interface protocol and the specified one or more parameter values; and
configuring the programmable logic device as a user non-volatile memory interface using the generated user non-volatile memory interface megafunction.

12. A method of providing compilable variations of a user non-volatile memory interface for an electronic device, the user non-volatile memory interface requiring specific settings before it can be compiled to unambiguous circuit blocks, the method comprising:

receiving a set of option settings containing user-selected settings for the user non-volatile memory interface, the set of option settings being selected from a plurality of sets of option settings wherein each set of option setting corresponds to one of a plurality of interface protocols;
generating a compilable variation file specifying the received set of option settings; and
using the compilable variation file to generate unambiguous circuit blocks of an electronic device; and
configuring the electronic device as the unambiguous circuit blocks using the generated user non-volatile memory interface megafunction;
wherein the electronic device includes a user accessible non-volatile memory and a raw UNVM interface for passing signals to and from the user accessible non-volatile memory and wherein the user non-volatile memory interface passes signals to and from the raw UNVM interface.

* * * * *